(12) United States Patent
Chou et al.

(10) Patent No.: US 7,492,078 B1
(45) Date of Patent: Feb. 17, 2009

(54) CIRCULAR PIEZOELECTRIC APPARATUS

(75) Inventors: Chin-Wen Chou, Taipei Hsien (TW); Ying-Nan Cheng, Taipei Hsien (TW)

(73) Assignee: Zippy Technology Corp., Hsin-Tien, Taipei Hsien (TW)

( * ) Notice: Subject to any disclaimer, the term of this patent is extended or adjusted under 35 U.S.C. 154(b) by 0 days.

(21) Appl. No.: 11/902,157

(22) Filed: Sep. 19, 2007

(51) Int. Cl.
*H01L 41/04* (2006.01)

(52) U.S. Cl. .................. 310/369; 310/359

(58) Field of Classification Search .......... 310/358, 310/369, 357
See application file for complete search history.

(56) References Cited

U.S. PATENT DOCUMENTS

| 2,953,755 | A | * | 9/1960 | Mattiat | ............ | 333/187 |
| 6,707,235 | B1 | | 3/2004 | Brebøl | | |
| 7,183,698 | B1 | * | 2/2007 | Chou et al. | ............ | 310/359 |

FOREIGN PATENT DOCUMENTS

TW            1253772 B        4/2006

* cited by examiner

*Primary Examiner*—Jaydi SanMartin
(74) *Attorney, Agent, or Firm*—Muncy, Geissler, Olds & Lowe PLLC

(57) ABSTRACT

A circular piezoelectric apparatus includes an electrode assembly which has an independent electrode located on a perimeter side wall of the circular piezoelectric apparatus and two separated electrodes located respectively at two opposite surfaces of the circular piezoelectric apparatus, a first structure located between the two separated electrodes that has a polarized direction coincided with a first axial direction directing from one electrode of the two separated electrodes to the other electrode thereof, and a second structure surrounding the first structure about the first axial direction and having a polarized direction coincided with a radial direction of the perimeter. One of the three electrodes is electrically connected a ground electrode to provide a voltage source for supplying an input voltage and a load through at least a conductive wire, and another electrode is electrically connected to an input electrode of the voltage source through another conductive wire.

4 Claims, 3 Drawing Sheets

CIRCULAR PIEZOELECTRIC APPARATUS

FIELD OF THE INVENTION

The present invention relates to a circular piezoelectric apparatus and particularly to a circular piezoelectric apparatus having a first structure and a second structure of different polarized directions that have input and output electrodes located respectively thereon and at a perimeter side wall.

BACKGROUND OF THE INVENTION

Piezoelectricity basically is a phenomenon of energy transformation between mechanical energy and electrical energy. As electric charges and strain have a cause-effect relationship, for material capable of generating piezoelectricity there is a crystal structure which can generate electron dipole moment when subject to an external force, a transformation phenomenon between mechanical energy and electrical energy takes places. This phenomenon is the source of piezoelectricity.

Generation of electron dipole moment is caused by a special arrangement between positive ions and negative ions in a crystal. Different crystal lattice systems in materials generate different electron dipole moments. The basic condition is the asymmetrical center of the crystal lattice. If there is a symmetrical center in the crystal lattice, the positive ions and negative ions are neutralized, then there is no electron dipole moment. And there is also no transformation between the mechanical energy and electrical energy. There are generally three types of transformation between the mechanical energy and electrical energy: 1. transforming mechanical energy to kinetic energy; 2. transforming electrical energy to mechanical energy; and 3. transforming electrical energy to mechanical energy, then to electrical energy again to be output. Piezoelectric ceramics have piezoelectric characteristic to perform mutual transformation between mechanical energy and electrical energy, thus are widely used in many types of applications, such as sensors to detect pressure, accelerometers, micromotors and the like. Moreover, piezoelectric films fit very well to the prevailing trend of slim and light of electronic products, and can be used on electronic elements for bio-detection and communication, thus receive a lot of attention in academics and industries.

The conventional piezoelectric structure adopts the principle of "unipoled PZT" discovered by Berlincourt in 1973. The principle is: alter the thickness relationship of the output/input area and the polarized area of a corresponding piezoelectric structure, a polarization process can be generated to change the step-up and step-down ratios of the piezoelectric structure. However, the conventional practice generally adopts a piezoelectric structure with a fixed distance between input/output electrodes and a ground electrode, and changeable polarized areas of the input/output electrodes to alter the step-up and step-down ratios. Such an approach creates a problem, namely to alter the step-up and step-down ratios, the polarized areas of input and output electrodes have to be changed, and the size of the piezoelectric structure also has to increase or decrease. This greatly affects the manufacturing techniques and installation space of the piezoelectric structure in the applications of industries.

U.S. Pat. No. 6,707,235 discloses an annular piezoelectric structure which includes a first portion and a second portion that generate vibration through an AC power supply and other portions to transform the piezoelectric structure. Its polarized direction is vertical to the perimeter surface of the annular body. It uses different shapes of the piezoelectric structure to generate different step-up and step-down ratios. The different shapes cause fabrication difficulty. R.O.C. patent No. 1253772 discloses a piezoelectric structure to provide an improvement. It has an output electrode and an input electrode spaced from a ground electrode at different distances. By changing the distance of the input electrode or output electrode relative to the ground electrode the step-up and step-down ratios of the piezoelectric structure can be altered. But its polarized direction is limited to the thickness direction, and the output/input voltage is determined by different thickness of the piezoelectric structure of the output/input electrodes. To get a greater output/input voltage ratio, the thickness difference also is greater. Hence the heights of the inner and outer rings of the circular piezoelectric sheets are uneven. Moreover, when the thickness is excessive it takes too much space of the already constrained internal space of electronic equipments. Hence how to improve the piezoelectric structure is a big issue remained to be overcome in the industry.

SUMMARY OF THE INVENTION

The primary object of the present invention is to provide a piezoelectric structure that has a first structure with a polarized direction coincided with a first axial direction and a second structure with a perimeter side wall surrounding the first structure that has a polarized direction coincided with a radial direction thereof. By altering the radial length of the perimeter of the second structure the output/input voltage ratio can be determined.

To achieve the foregoing object the present invention provides a circular piezoelectric apparatus which includes an electrode assembly which has an independent electrode located on a perimeter side wall and two separated electrodes located respectively at two opposite surfaces of the circular piezoelectric apparatus, a first structure located between the two separated electrodes that has a polarized direction coincided with a first axial direction directing from one electrode of the two separated electrodes to the other electrode thereof, and a second structure surrounding the first structure about the first axial direction and having a polarized direction coincided with a radial direction of the perimeter. One of the three electrodes is electrically connected a ground electrode to provide a voltage source for supplying an input voltage and a load through at least a conductive wire, and another electrode is electrically connected to an input electrode of the voltage source through another conductive wire, and the remained one electrode becomes an output electrode to support the load by stepping up or down of the input voltage of the voltage source through the input electrode and the polarized direction of the first and second structures. The output/input electrodes are located respectively on the first and second structures. The ground electrode is one of the two separated electrodes.

Another object of the invention is to suppress waveform interference. This is accomplished by forming an arched and protrusive portion in the thickness direction of the second structure.

The foregoing, as well as additional objects, features and advantages of the invention will be more readily apparent from the following detailed description, which proceeds with reference to the accompanying drawings.

DETAILED DESCRIPTION OF THE PREFERRED EMBODIMENTS

Figure 1:
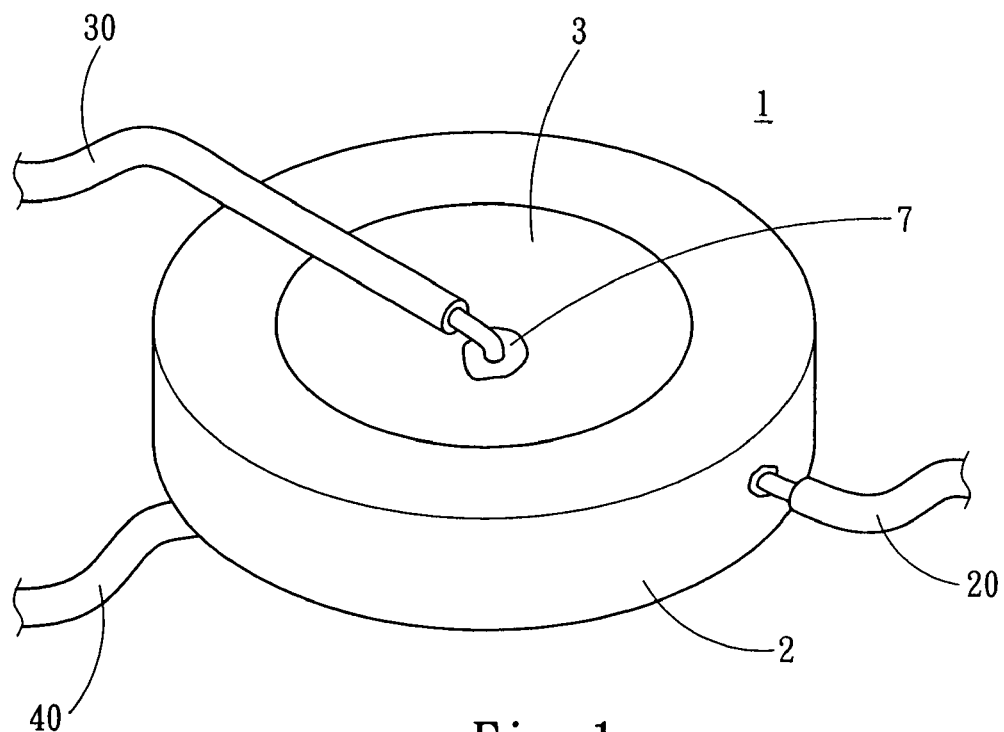
FIG. 1 is a perspective view of an embodiment of the invention.
Figure 2:
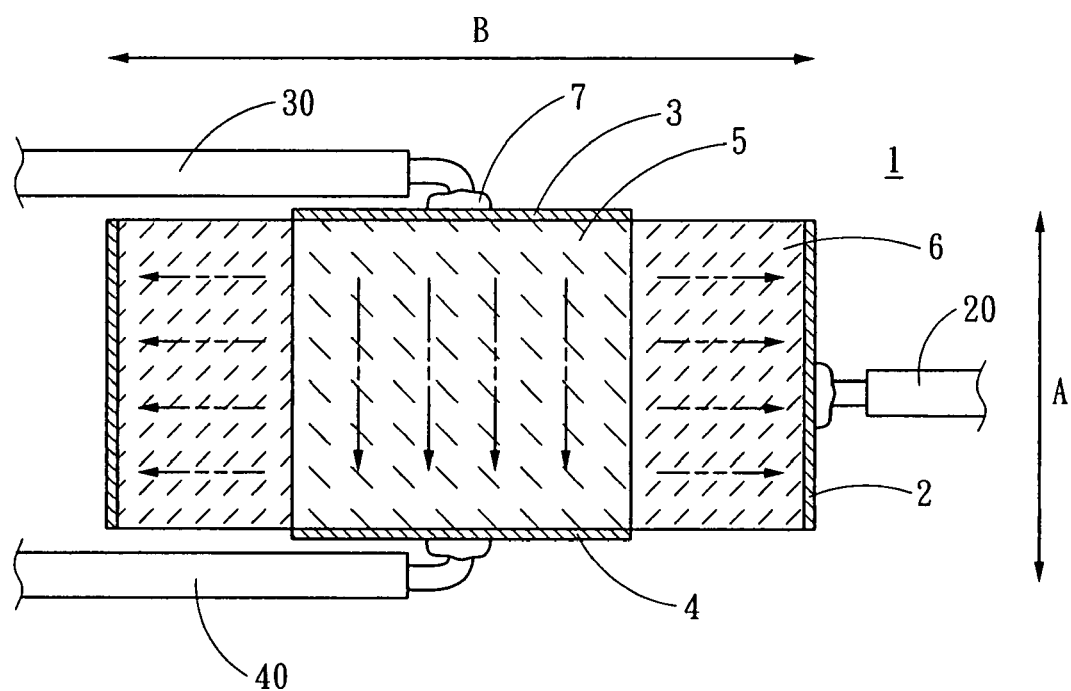
FIG. 2 is a sectional view of an embodiment of the invention.
Figure 3:
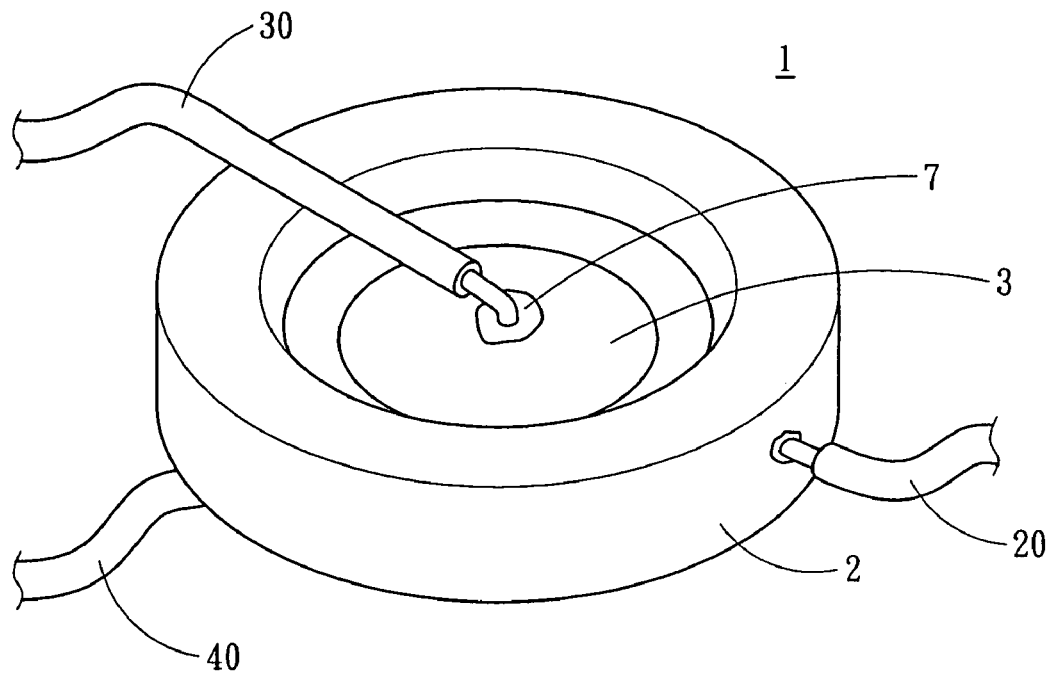
FIG. 3 is a perspective view of another embodiment of the invention.
Figure 4:
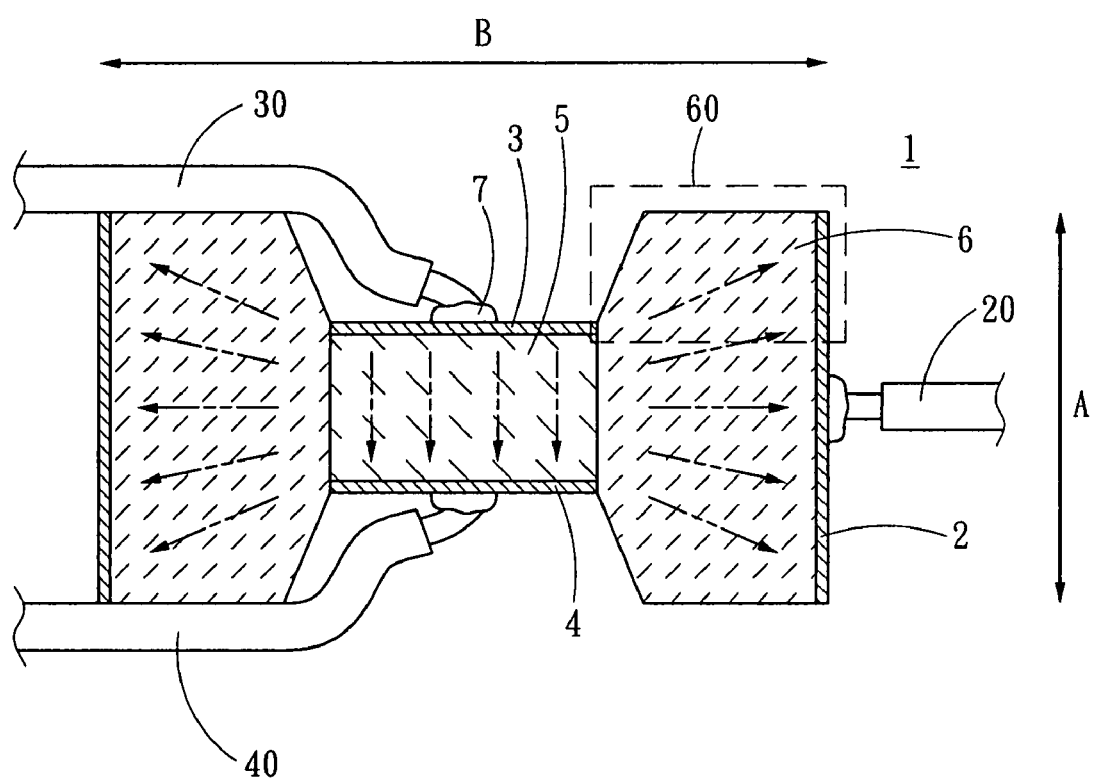
FIG. 4 is a sectional view of another embodiment of the invention.
Figure 5:
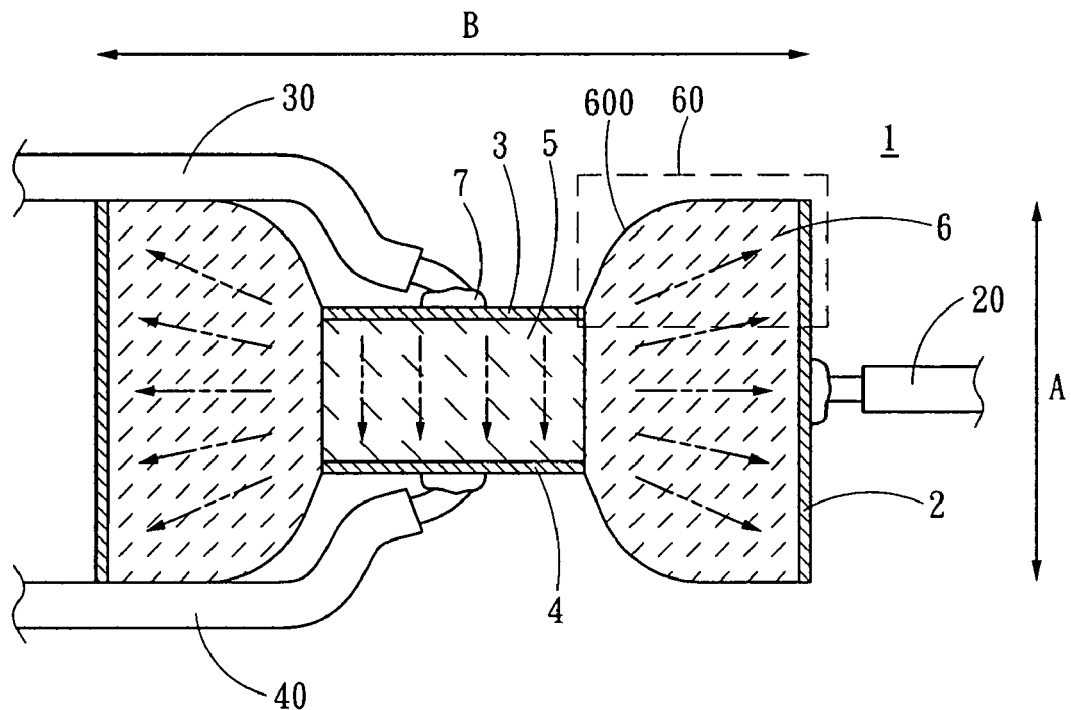
FIG. 5 is a sectional view of yet another embodiment of the invention.
Figure 6:
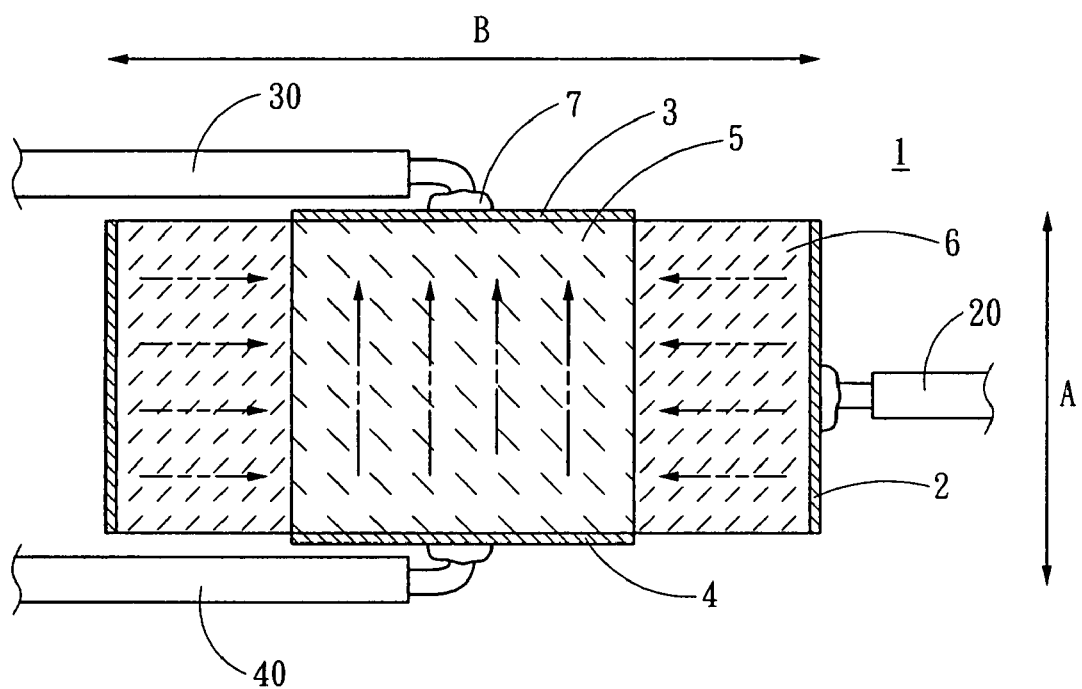
FIG. 6 is a sectional view of still another embodiment of the invention.

Please refer to FIGS. 1 and 2 for an embodiment of the invention. The circular piezoelectric apparatus 1 of the invention includes:

an electrode assembly which has an independent electrode 2 located on a perimeter side wall of the circular piezoelectric apparatus 1 and two separated electrodes 3 and 4 located respectively at two opposite surfaces of the circular piezoelectric apparatus 1;

a first structure 5 which is located between the two separated electrodes 3 and 4, and has a polarized direction coincided with a first axial direction A directing from one electrode of the two separated electrodes to the other electrode thereof. The first structure 5 in this embodiment is circular; and a second structure 6 surrounding the first structure 5 about the first axial direction A and having a polarized direction B coincided with a radial direction of the perimeter. In this embodiment the second structure 6 is formed according to the circular perimeter of the first structure 5 and becomes annular. Referring to FIGS. 1, 2 and 6, the first structure 5 and the second structure 6 have a same thickness. FIGS. 3 and 4 show another embodiment in which the second structure 6 has a greater thickness than the first structure 5 and a protrusive portion 60 in the thickness direction of the second structure 6. FIG. 5 illustrates yet another embodiment in which the second structure 6 has a greater thickness than the first structure 5 and an arched portion 600 at the edge of a polarized spot of the first structure 5 and the second structure 6 to suppress waveform interference and prevent waveform interference on the independent electrode 2 located on the perimeter side wall.

The three electrodes and the first and second structures 5 and 6 may be coated with a conductive material 7 to facilitate soldering of the electrodes. One of the three electrodes is electrically connected a ground electrode to provide a voltage source for supplying an input voltage and a load through at least a conductive wire, another electrode is electrically connected to an input electrode of the voltage source through another conductive wire, and the remained one electrode becomes an output electrode to support the load by stepping up or down of the input voltage of the voltage source through the input electrode and the polarized direction of the first and second structures 5 and 6. The output/input electrodes are located respectively on the first and second structures 5 and 6. The ground electrode is one of the two separated electrodes 3 and 4.

For instance, one separated electrode 3 is electrically connected to the input electrode of the voltage source through a conductive wire 30, and another separated electrode 4 is electrically connected to the ground electrode of the voltage source and load through another conductive wire 40. The independent electrode 2 is electrically connected to the output electrode of the load through yet another conductive wire 20 (referring to FIGS. 1 through 5).

Another alternative is having the separated electrode 3 electrically connected to the output electrode of the load through the conductive wire 30, and another separated electrode 4 electrically connected to the ground electrode of the voltage source and load through the another conductive wire 40, while the independent electrode 2 electrically connected to the input electrode of the input electrode of the voltage source through yet another conductive wire 20 (referring to FIG. 6). Furthermore, the piezoelectric sheets are not limited to circular. As long as they are annular and have different polarized directions for the first structure 5 and second structure 6, the objects of the invention can be accomplished.

As a conclusion, the invention has the output and input electrodes located respectively at the first structure 5 which has the polarized direction coinciding with the first axial direction A and the second structure 6 on the perimeter side wall surrounding the first structure 5 that has the polarized direction coinciding with the radial direction B. By altering the radial length of the perimeter of the second structure 6 output/input voltage ratio can be determined. Thus the problem of excessive thickness of the piezoelectric sheets occurred to the conventional techniques can be prevented. Moreover, the arched portion 600 can eliminate the waveform interference during oscillation of mechanical energy. It provides a significant improvement over the conventional techniques.

While the preferred embodiments of the invention have been set forth for the purpose of disclosure, modifications of the disclosed embodiments of the invention as well as other embodiments thereof may occur to those skilled in the art. Accordingly, the appended claims are intended to cover all embodiments which do not depart from the spirit and scope of the invention.

What is claimed is:

1. A circular piezoelectric apparatus, comprising:

an electrode assembly which has an independent electrode located on a perimeter side wall of the circular piezoelectric apparatus and two separated electrodes located respectively at two opposite surfaces of the circular piezoelectric apparatus;

a first structure which is located between the two separated electrodes and has a polarized direction coinciding with a first axial direction directing from one electrode of the two separated electrodes to the other electrode thereof; and a second structure surrounding the first structure about the first axial direction and having another polarized direction coincided with a radial direction of the perimeter;

wherein one of the three electrodes is electrically connected to a ground electrode to provide a voltage source for supplying an input voltage and a load through at least a conductive wire, another electrode is electrically connected to an input electrode through another conductive wire, and the remaining one electrode becomes an output electrode by stepping-up or stepping-down of an input voltage of the voltage source through the input electrode and the polarized directions of the first and second structures, the output and input electrodes being located respectively on the first and second structures, the ground electrode being one of the two separated electrodes; and wherein the first structure and the second structure form an arched portion abutting the edge of a polarized spot thereof to suppress waveform interference.

2. The circular piezoelectric apparatus of claim 1, wherein the second structure has a thickness greater than the first structure and a protrusive portion formed in the thickness direction of the second structure.

3. The circular piezoelectric apparatus of claim 1, wherein the input electrode is one of the two separated electrodes, and the output electrode is the independent electrode.

4. The circular piezoelectric apparatus of claim 1, wherein the output electrode is one of the two separated electrodes, and the input electrode is the independent electrode.

* * * * *